United States Patent
Payne et al.

(10) Patent No.: US 12,253,356 B2
(45) Date of Patent: Mar. 18, 2025

(54) CIRCUITS AND METHODS TO CALIBRATE MIRROR DISPLACEMENT

(71) Applicant: TEXAS INSTRUMENTS INCORPORATED, Dallas, TX (US)

(72) Inventors: Robert Floyd Payne, McKinney, TX (US); James Norman Hall, Parker, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 881 days.

(21) Appl. No.: 17/240,483

(22) Filed: Apr. 26, 2021

(65) Prior Publication Data
US 2022/0342202 A1    Oct. 27, 2022

(51) Int. Cl.
*G01B 7/14*    (2006.01)
*G01B 7/06*    (2006.01)
(Continued)

(52) U.S. Cl.
CPC ........... *G01B 7/08* (2013.01); *G01R 27/2605* (2013.01); *B81B 2201/042* (2013.01); *G01B 7/14* (2013.01);
(Continued)

(58) Field of Classification Search
CPC ........ G02B 26/0841; G09G 2320/0693; G01R 17/00; G01R 27/2605; G01R 35/005; G01B 7/08; G01B 7/14; B81B 2201/042
See application file for complete search history.

(56) References Cited

U.S. PATENT DOCUMENTS

| 5,528,520 A | * | 6/1996 | Kemp | ..................... G01P 21/00 73/514.32 |
| 10,371,939 B2 | | 8/2019 | McDonald et al. | |

(Continued)

FOREIGN PATENT DOCUMENTS

WO    WO-2019234503 A2 * 12/2019

OTHER PUBLICATIONS

Barlett et al., "Adapting Texas Instruments DLP technology to demonstrate a phase spatial light modulator," SPIE OPTO, 2019, San Francisco, CA, pp. 1-14.

*Primary Examiner* — Lisa M Caputo
*Assistant Examiner* — Christian T Bryant
(74) *Attorney, Agent, or Firm* — Michelle F. Murray; Frank D. Cimino

(57) ABSTRACT

A calibration circuit providing a programmable voltage generator that is selectively connectable to a first capacitor plate of a capacitive structure to supply a voltage thereto. A reference voltage generator is coupled to the output of the programmable voltage generator and generates a reference voltage. A comparator receives the reference voltage and a discharging voltage from the capacitive structure during a discharge period and, based on those inputs, generates a signal that is output to a digital controller. A constant current source is selectively connectable to the capacitive structure to generate a constant current. Based on the output of the comparator, the constant current, and a count representing a time during which the discharging voltage decreases, the digital controller measures capacitance to calibrate a movable mirror of the capacitive structure. During calibration, the digital controller controls the programmable voltage generator and a second capacitor plate of the capacitive structure.

20 Claims, 7 Drawing Sheets

(51) Int. Cl.
*G01R 17/00* (2006.01)
*G01R 27/26* (2006.01)
G01R 35/00 (2006.01)
G02B 26/08 (2006.01)

(52) U.S. Cl.
CPC ............ *G01R 17/00* (2013.01); *G01R 35/005* (2013.01); *G02B 26/0841* (2013.01); *G09G 2320/0693* (2013.01)

(56) References Cited

U.S. PATENT DOCUMENTS

| | | | |
|---|---|---|---|
| 2008/0273234 A1 | 11/2008 | Mehrl et al. | |
| 2012/0299952 A1 | 11/2012 | Huibers et al. | |
| 2013/0321379 A1* | 12/2013 | Van Lier | H02N 1/006 |
| | | | 318/116 |
| 2018/0183357 A1* | 6/2018 | Ouattara | G01J 3/26 |
| 2019/0306641 A1* | 10/2019 | Wilson | H04R 29/004 |
| 2020/0116992 A1* | 4/2020 | Teichmann | G01J 3/26 |

* cited by examiner

CIRCUITS AND METHODS TO CALIBRATE MIRROR DISPLACEMENT

FIELD OF DISCLOSURE

This disclosure relates generally to calibrating or tuning controlling one or more electrostatically actuated mirrors to adapt to variations, and more particularly to circuits and methods to calibrate displacement of such mirror(s) in a device such as a phase light modulator (PLM).

BACKGROUND

Actuators (e.g., electrostatic and non-electrostatic) are used in a variety of technologies. For example, actuators may be used in light modulators to vary modulation of a beam of light. Actuators have been employed in digital micromirror devices (DMDs), which is an optical microelectromechanical system (MEMS), which make use of many positional micromirrors (pixels) that are moved between distinct positions or states to modulate light. Such microelectromechanical actuator systems include a base electrode and a spring electrode coupled to the micromirror. When a voltage differential is created between the base electrode coupled to a base of a pixel and the spring electrode, the spring electrode moves relative to the base electrode, thereby moving the micromirror to a different position. Such light modulator systems are used in, for example, high dynamic range cinema, light detection and ranging systems, high volume optical switching (e.g., used in telecom or server farms), microscopy/spectroscopy/adaptive optics (e.g., used in astronomy ophthalmology, machine vision, etc.), and holographic displays.

To further expand the use of DMD technology to other applications that may benefit from more precise and efficient manipulation of light, DMD technology has been adapted to develop a phase light modulator (PLM). In a PLM, a digital code (address bits) is applied to address electrode(s) on a base plate (base electrode) to set the vertical displacement of the corresponding micromirror to specific fractions of a desired wavelength of light. The displacement of a micromirror is determined by various factors including the digital code, the address electrode(s) opposing the micromirror, the difference between the voltage of the micromirror and the voltage applied to the address electrodes, the distance between the micromirror in its rest position and the address electrodes, and the restoring force of the micromirror spring, which force is temperature dependent and may vary over the lifetime of the device.

Due to variations in the manufacturing process, one or more of these factors may differ from device to device and even between micromirrors in the same device. Moreover, a device may have to support multiple wavelengths and produce predictable results over its lifetime. A fixed lookup table relating displacements to respective control parameters (micromirror voltages and address electrode settings) does not account for these variations, nor does a one-time factory calibration. A solution to these issues is desirable.

SUMMARY

In accordance with an example, a calibration circuit is provided. The example calibration circuit comprises a programmable voltage generator having an input and an output, the latter of which is selectively connected to a first capacitor plate of a capacitive structure to supply a voltage to the capacitive structure. The example calibration circuit further comprises a digital controller having an input and first and second outputs. The first output of the digital controller is coupled to the input of the programmable voltage generator and the second output is coupled to a second capacitor plate of the capacitive structure. A reference voltage generator has an input coupled to the output of the programmable voltage generator. The reference voltage generator generates a reference voltage, which is output to a reference voltage input of a comparator. The comparator also has a discharging voltage input that is selectively connected to the capacitive structure to receive a discharging voltage during a discharge period. An output of the comparator is coupled to the input of the digital controller. A constant current source is selectively connectable to the capacitive structure to supply a constant current during the discharge period.

In accordance with an example, a method comprises setting first and second capacitor plates of a capacitive structure to an initial displacement position; applying a known control voltage to at least one of the first and second capacitor plates to generate a first displacement; measuring a first capacitance of the capacitive structure at the first displacement; setting the first and second capacitor plates to a second displacement; measuring a second capacitance of the capacitive structure at the second displacement; determining the difference between the first and second capacitances to determine the difference between the first and second displacements; and adjusting the control voltage based on results of the determining operation.

In accordance with an example, a method comprises applying a control voltage to a capacitive structure including first and second capacitor plates; transmitting a first code to the capacitive structure to set the first and second capacitor plates in a first state of displacement; measuring a first capacitance of the capacitive structure in the first state of displacement; transmitting a second code to the capacitive structure to set the first and second capacitor plates in a second state of displacement; measuring a second capacitance of the capacitive structure in the second state of displacement; and determining a difference between the displacements in the first and second states based on the difference between the measured first capacitance and the measured second capacitance.

These and other features will be better understood from the following detailed description with reference to the accompanying drawings.

BRIEF DESCRIPTION OF THE DRAWINGS

Features of the disclosure may be understood from the following figures taken in conjunction with the detailed description.

DETAILED DESCRIPTION

Figure 1A:
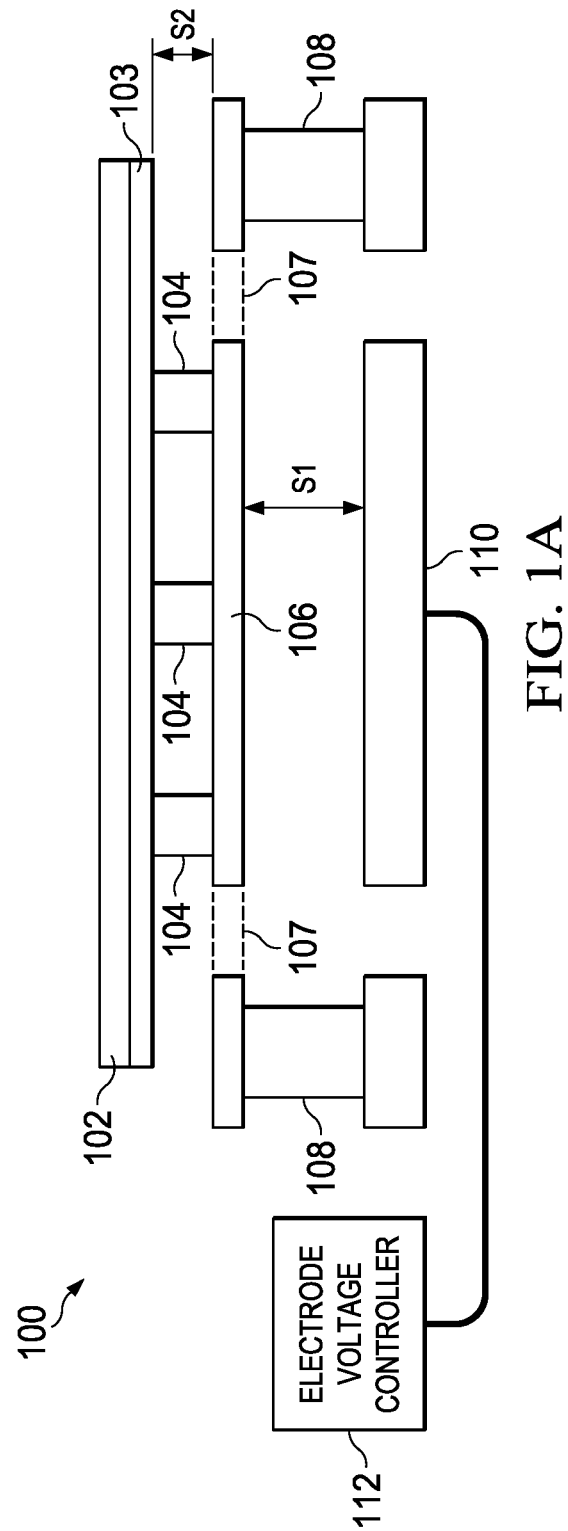
FIGS. 1A, 1B and 1C illustrate an example of a pixel structure including a mirror and an electrostatic actuator.

Specific examples are described below in detail with reference to the accompanying figures. These examples are not intended to be limiting. In the drawings, corresponding numerals and symbols generally refer to corresponding parts unless otherwise indicated. The objects depicted in the drawings are not necessarily drawn to scale.

The terms "connected," "coupled" and derivatives thereof, as used herein, include direct connection or coupling between two elements, indirect connection or coupling through one or more intervening elements, as well as contactless or wireless communication. Relative terms such as "top," "bottom," "base" and the like indicate relative position with respect to the orientation being described or as shown in the drawing under discussion; such terms do not indicate absolute position or orientation. Directional terms, i.e., "downwardly" and the like are also relative to the context of what is being described. These terms do not require that any device or structure be constructed or operated in a particular orientation.

In example arrangements, a mirror (or group of mirrors) in a device may be calibrated to establish and/or maintain a specific relationship between each of multiple displacement targets of a mirror and its corresponding control parameter (s) to accommodate different operating wavelengths, to compensate for process, voltage, temperature variations, and/or to adjust for drift associated with age. Calibration can be conveniently performed when the device is powered up and/or periodically during operation. Calibration can be done at the device level in which all mirrors are calibrated together, or at a finer level, e.g., different groups of mirrors are calibrated differently, to accommodate for variation across the array of mirrors or provide different displacement target—control parameter(s) relationships for different groups of mirrors.

In an example, the voltage applied to a mirror being calibrated is set to its minimum value and a voltage applied to the address electrode(s) of the mirror's associated base plate is set to its expected operating voltage. The capacitance of the mirror structure is measured at one setting of the address electrode(s). The setting of the address electrode(s) is then changed, and the capacitance of the mirror structure is measured again at the new setting. The difference in the two capacitance measurements corresponds to the difference in displacement between the two settings. If the difference in displacement is less than desired, the difference in the applied voltages is increased to increase electrostatic force and hence increase displacement. If the difference in displacement is greater than desired, the voltage differential may be decreased. After adjustment of the voltage differential in either direction, the process may be repeated until the difference in displacement is as desired.

All mirrors in an array of mirrors may be calibrated together. In another example, different groups of mirrors within the array may be calibrated differently. In that scenario, the above-described process may be applied to each mirror in a given group to calibrate those mirrors a particular way. The process may then be applied to each mirror of a different group using different control parameters, i.e., different voltages and electrode address settings, to calibrate those mirrors in a different way. Calibration may be done in situ, i.e., by circuits and components in the device, e.g., PLM, in which the mirror(s) reside, thereby avoiding the need for additional overhead for calibration.

Figure 1B:
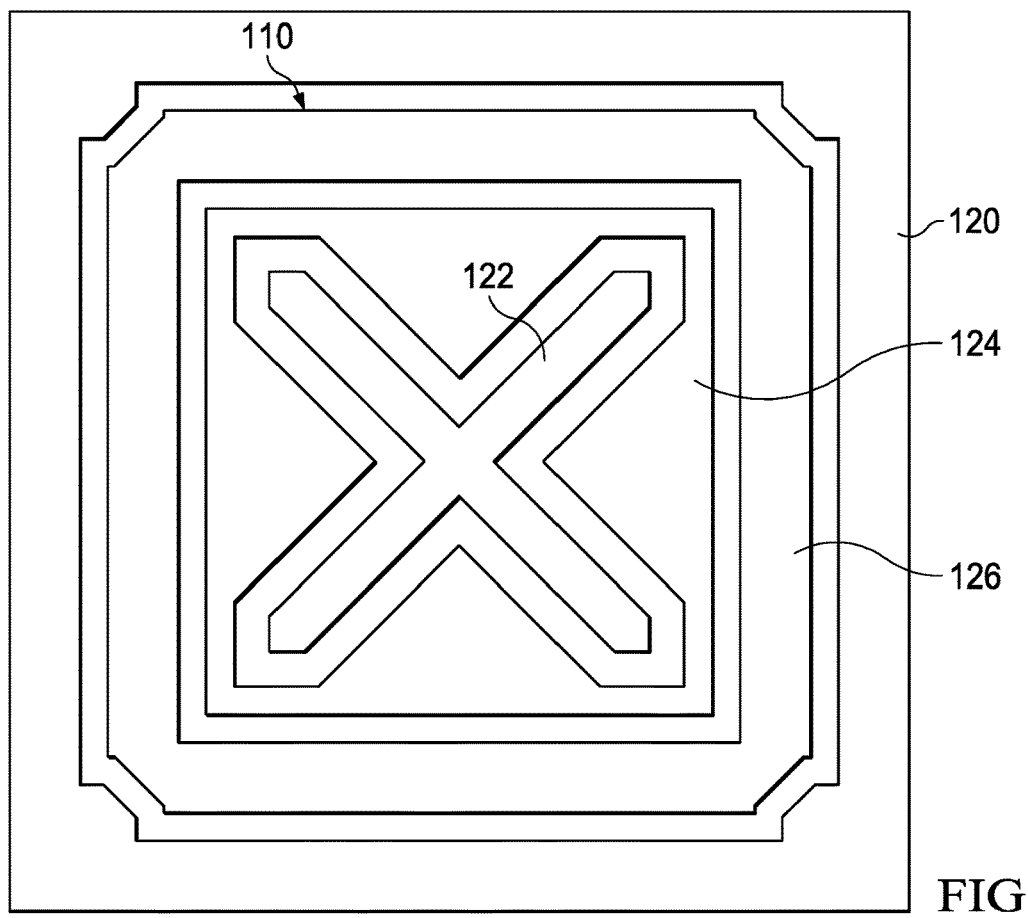
Figure 1C:
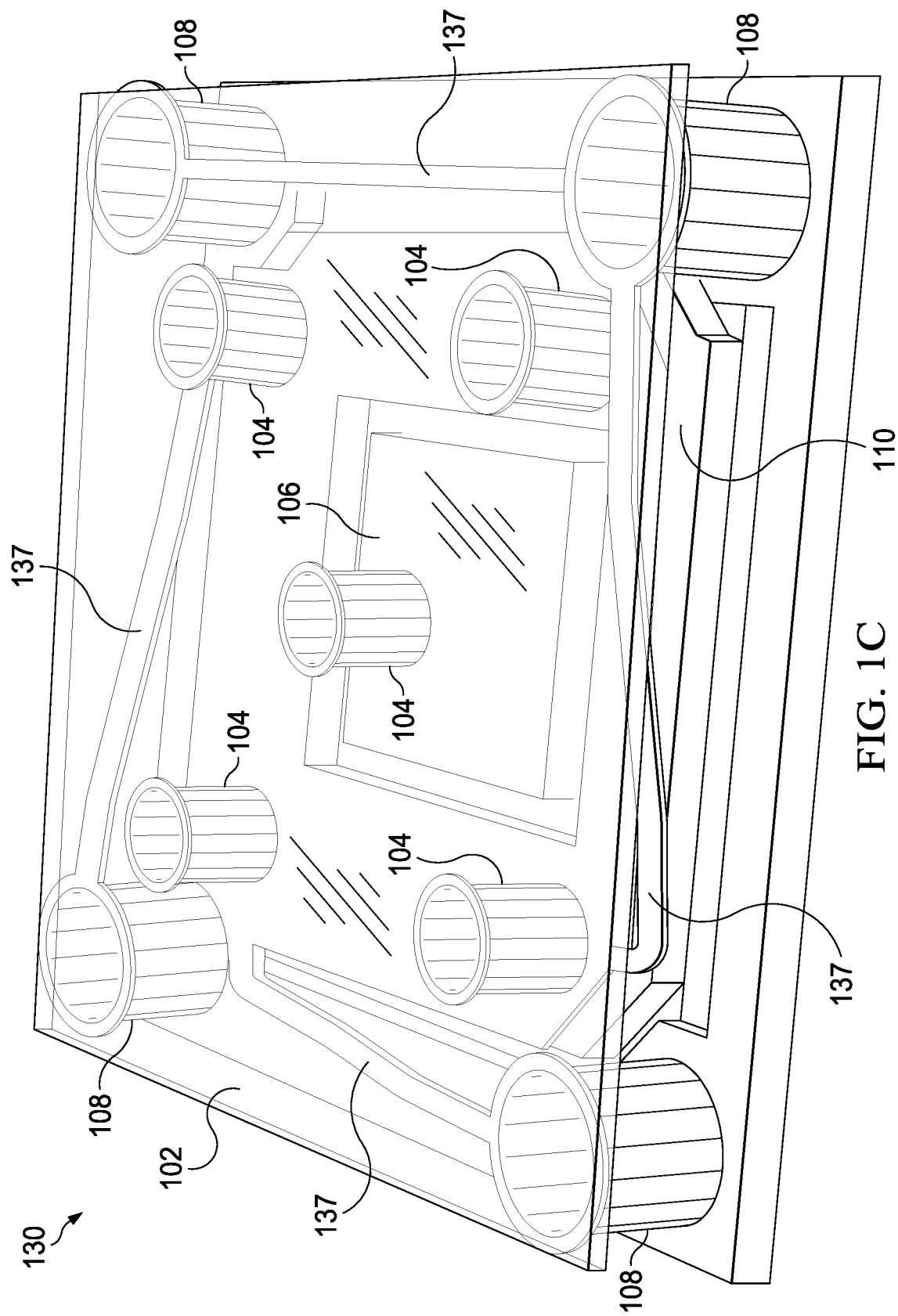

FIGS. 1A, 1B and 1C (collectively, FIG. 1) are diagrams showing example structures and electrostatic actuator design. FIG. 1A illustrates an example structure 100 (e.g., pixel structure) of a parallel-plate electrostatic actuator (e.g., which may be used to implement a MEMS PLM). FIG. 1B shows an example electrode pattern 120 that may be employed in structure 100. FIG. 1C shows an example plate or pixel geometry 130 that may be used to implement structure 100.

Referring to FIG. 1A, structure 100 includes a mirror 102, structure plate 103, mirror attachments 104 (e.g., mirror vias), a top plate 106, flexural beams 107, support posts 108, base plate 110, and electrode voltage controller 112. Mirror 102 reflects a beam of light in two or more directions depending on the position of the mirror. For example, mirror 102 may be extended in a first position (e.g., a neutral position when no voltage is applied to base plate 110) to reflect light in a first direction and be retracted to a second position to reflect light in a second direction. Different voltages may be applied to base plate 110 to change the distance (displacement) between it and mirror 102. In an arrangement of many mirrors 102, their movements result in directional beam steering based on a summation of the positions of the mirrors 102. Each individual mirror displacement results in a fractional change in the phase of the light incident on it.

Mirror 102 may be supported by (e.g., hosted within) structural plate 103. Mirror 102 is attached to top plate 106 by coupling structural plate 103 to mirror attachments 104, which are coupled to top plate 106. In another example construction, structural plate 103 may be omitted, in which case mirror 102 may be directly coupled to mirror attachments 104. Mirror 102 and structural plate 103 (when used) are configured to be larger than top plate 106, such that mirror 102 and structural plate 103 (when used) overlap support posts 108. In this manner, support posts 108 act as a mechanical stop to mirror 102 (and structural plate 103) past a preset position corresponding to the height of support posts 108. Although example structure 100 includes three mirror attachments, structure 100 may include any suitable number of mirror attachment(s).

Top plate 106 is an electrode that includes flexural beams 107. Flexural beams 107 correspond to a mechanical spring constant that, when stretched, applies a mechanical force in the opposite direction of the stretching. Flexural beams 107 are attached to support posts 108. In this manner, when an electrostatic force is applied to top plate 106 to move it downwardly, flexural beams 107 extend toward base plate 110, causing top plate 106 to lower to a different position. Top plate 106 and flexural beams 107 may be made of the same material. Mirror attachments 104 may provide rigidity to top plate 106 to ensure that it does not flex as the electrostatic force increases. Support posts 108 may be longer in length than mirror attachments 104, i.e., S1>S2, to prevent top plate 106 from getting too close to base plate 108.

The amount of voltage applied to base plate 110 determines how much top plate 106 is displaced. In a PLM, base plate 110 has a digital-style electrode design, in which multiple electrode segments can be selectively energized by loading data into an underlying memory array, e.g., an SRAM memory array. In an example, as shown in FIG. 1B, base plate 110 includes an electrode pattern 120 that includes three electrode segments: an inner electrode 122, a middle electrode 124 and an outer electrode 126. Each of these electrodes can be held at 0 V (off state) or driven to a set non-zero voltage ($V_{OFFSET}$), e.g., 10 V (on state), enabling eight different combinations. Thus, these three electrodes form a 3-bit cell capable of 8 unique addressable states, each specified by a unique 3-digit code. The electrode areas may be designed so that four of the addressable states will produce an approximately linear displacement profile. Top plate 106 (and mirror 102) is connected to a mirror bias signal that is typically held at a 0 V reference state, although the mirror bias signal can be "trimmed" to a non-zero value for performance adjustment and calibration. $V_{OFFSET}$ can also be changed during calibration. When one or more of electrodes 122, 124 and 126 are activated, a potential difference between top plate 106 and base plate 110 is generated. This creates an electrostatic force that deflects top plate 106 (and mirror 102) until an equilibrium state is reached with the spring restoration force. This design operates in a non-contact mode with displacements up to about one third the initial electrostatic gap. Each electrode address state has a target displacement at the 0 V reference state of the mirror bias signal.

FIG. 1C shows an example plate geometry 130 (e.g., pixel geometry) that may be used to implement pixel structure 100. Plate geometry 130 is square-based. Thus, mirror 102, top plate 106 and base plate 110 each has a square shape. In the illustrated example, plate geometry 130 includes five mirror attachments 104 to couple top plate 106 to mirror 102, although any suitable number of mirror attachments 104 may be used.

In this example, the structure includes extended flexural beams 137 which attach to support posts 108 and top plate 106. Extended flexural beams 137 work in a similar manner to flexural beams 107. Extended flexural beams 137, however, are longer, thereby providing more spring/flexibility than flexural beams 107. More spring allows top plate 106 to move with less electrostatic force, and hence less voltage need be applied. Alternatively, flexural beam 107 of FIG. 1A may be used to attach support posts 108 to top plate 106.

FIG. 1C represents one possible plate geometry, i.e., square-based geometry. The calibration features described herein, however, are not limited to square-based geometry. The calibration may be performed with any suitable geometry, including rectangle-based, triangle-based, circle-based, hexagonal-based, etc.

Figure 2:
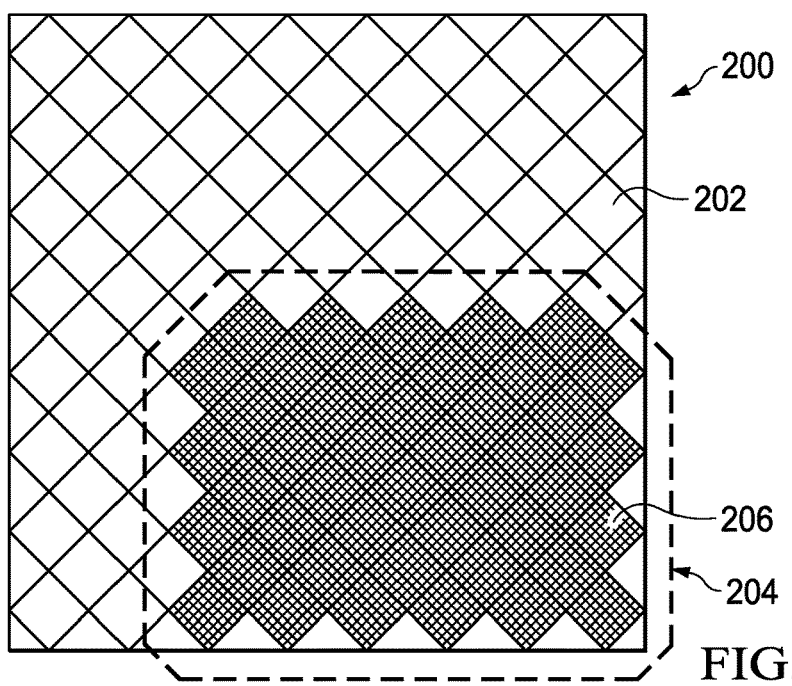
FIG. 2 illustrates an example of an array of mirrors, which may be employed in a PLM or other suitable device.

FIG. 2 is a schematic view of an array of mirrors 200, i.e., multiple mirrors, one of which is identified by reference numeral 202. All mirrors 202 of array 200 may be calibrated together. Alternatively, two or more groups of mirrors may be calibrated differently. To that end, FIG. 2 illustrates a group of mirrors 204, which is a subset of the mirrors in array 200. Each mirror 206 in group 204 may be calibrated together, and these mirrors 206 may be calibrated differently than the other mirrors of array 200.

Figure 3:
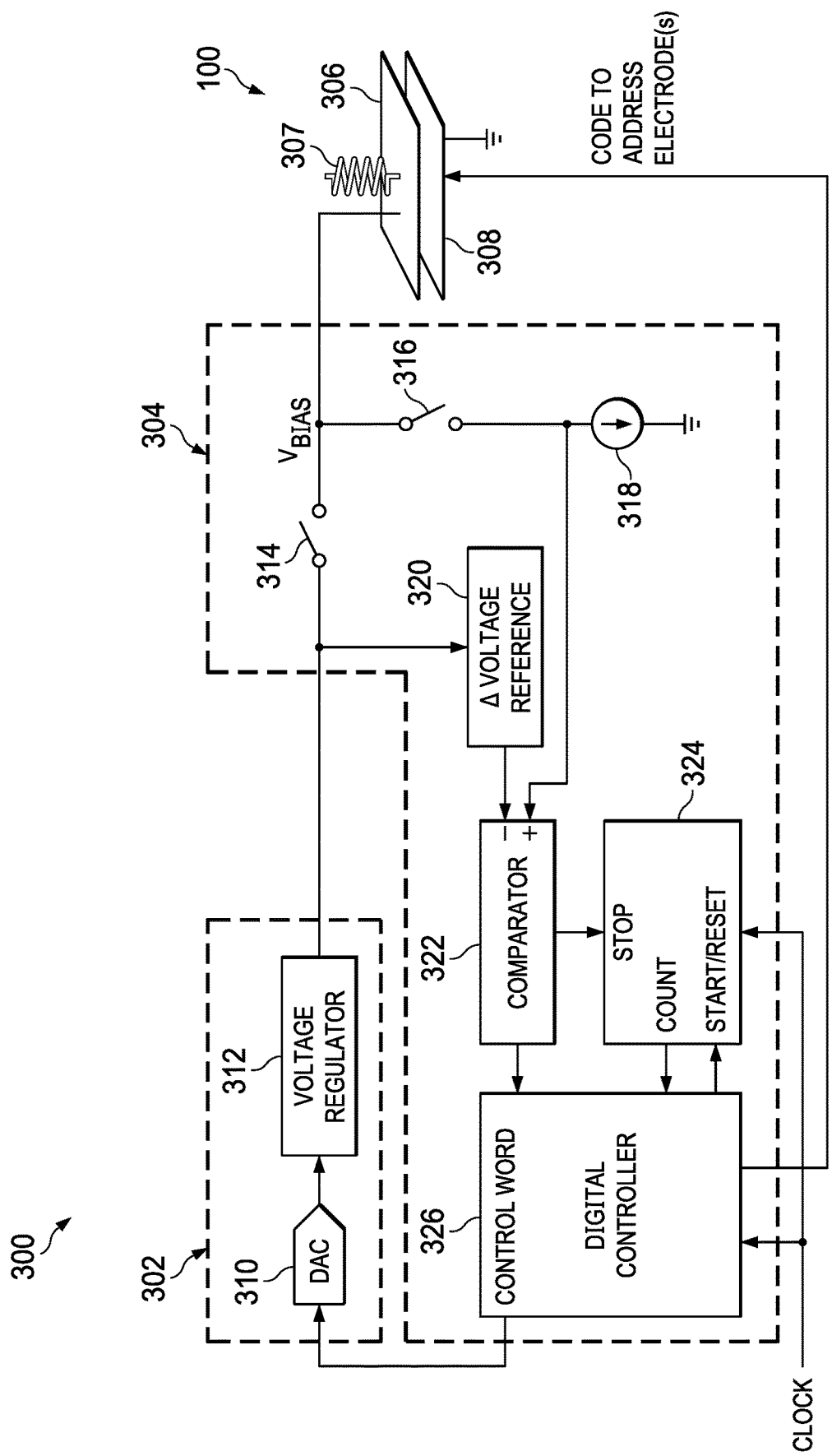
FIG. 3 is a block diagram of an example of a calibration circuit that may be used to calibrate one or more mirrors.

FIG. 3 is a block diagram of an example of a calibration circuit 300 that may be used to calibrate a movable mirror structure, i.e., pixel structure 100, in a device such as a PLM. Calibration circuit 300, which is electrically coupled to pixel structure 100, includes a programmable voltage generator 302 and a capacitance measurement circuit 304.

Pixel structure 100 may be constructed as described in connection with FIG. 1. As shown in FIG. 3, pixel structure 100 includes a top capacitor plate 306 and a bottom capacitor plate 308. Top capacitor plate 306 may correspond to the assembly of mirror 102, structure plate 103 and mirror attachments 104 of FIG. 1. Bottom capacitor plate 308 may correspond to base plate 110 of FIG. 1. Bottom capacitor plate 308 includes one or more electrodes, as shown in FIG. 1. Pixel structure 100 also includes a spring 307 that provides a restoring force to top capacitor plate 306. Spring 307, shown schematically in FIG. 3, may correspond to flexural beams 107/137 of FIG. 1.

Programmable voltage generator 302 may include a digital-to-analog converter (DAC) 310 that has a digital input at which DAC 310 receives a control word or code from capacitance measurement circuit 304. Based on that code, DAC 310 generates an analog signal that is applied to the input of a voltage regulator 312 of the programmable voltage generator 302. Voltage regulator 312, under the control of DAC 310, generates different values of a voltage (VDAC) that is supplied to top capacitor plate 306.

Capacitance measurement circuit 304 includes two switches: switch 314 that, when closed, connects the output of voltage regulator 312 to top capacitor plate 306, and switch 316 that, when closed, connects a constant current source 318 of circuit 304 to top capacitor plate 306. Constant current source 318 generates constant current $I_{REF}$.

A reference voltage generator (Δ Voltage Reference) 320 of capacitance measurement circuit 304 is coupled to the output of voltage regulator 312 and generates a reference voltage ($V_{REF}$) that is a fixed difference from VDAC, i.e., the voltage generated by voltage regulator 312. Capacitance measurement circuit 304 further includes a comparator 322. The positive input of comparator 322 is coupled to top capacitance plate 306, and the negative input of comparator 322 is coupled to the output of reference voltage generator 320. Thus, during a capacitance measurement sequence when the capacitor (first and second capacitance plates 306 and 308) is discharging, comparator 322 compares the discharging voltage $V_{BIAS}$ to $V_{REF}$ and outputs a digital signal when the sign of ($V_{BIAS}-V_{REF}$) changes.

Capacitance measurement circuit 304 also includes a digital counter/timer 324 and a digital controller 326, both of which are clocked components. To that end, each of digital counter/timer 324 and digital controller 326 has an input at which a clock signal received. Digital counter/timer 324 receives a "start" input signal from digital controller 326 at the start of a capacitance measurement sequence to begin counting and receives a "stop" input signal from comparator 322 to stop counting at substantially the same time that comparator 322 outputs the digital signal to digital controller 326, which marks the end of that capacitance measurement sequence. In response to receiving the "stop" signal from comparator 322, digital counter/timer 324 outputs the count to digital controller 326. Digital controller 326, which may correspond to electrode voltage controller 112 of FIG. 1, also resets the counter after the current capacitance measurement sequence is completed and before the next capacitance measurement sequence is performed.

Digital controller 326, which may operate as a state machine, is configured to perform numerous functions in addition to controlling start and reset of digital counter/timer 324. Digital controller 326 also controls the sequence of each of the capacitance measurements. For each measurement (or set of measurements) to be made with the mirror(s) at a specific state or displacement, digital controller 326 generates a code (control word) and transmits the code to the digital input of DAC 310 for generation of a value of VDAC to be applied to top capacitor plate 306. Digital controller 326 also generates a code or address bits that are transmitted to bottom capacitor plate 308 to drive each of its electrodes to a specific state.

Digital controller 326 also calculates capacitance across top and bottom capacitor plates 306 and 308 based on the count received from digital counter/timer 324, the sign change output of comparator 322, $I_{REF}$, which represents the current across the capacitance plates 306 and 308. $I_{REF}$ is stored in, or otherwise made known to, digital controller 326. After such calculation, digital controller 326 is able to store the calculation, and over the course of the overall measurement process store multiple capacitance measurements.

Figure 4:
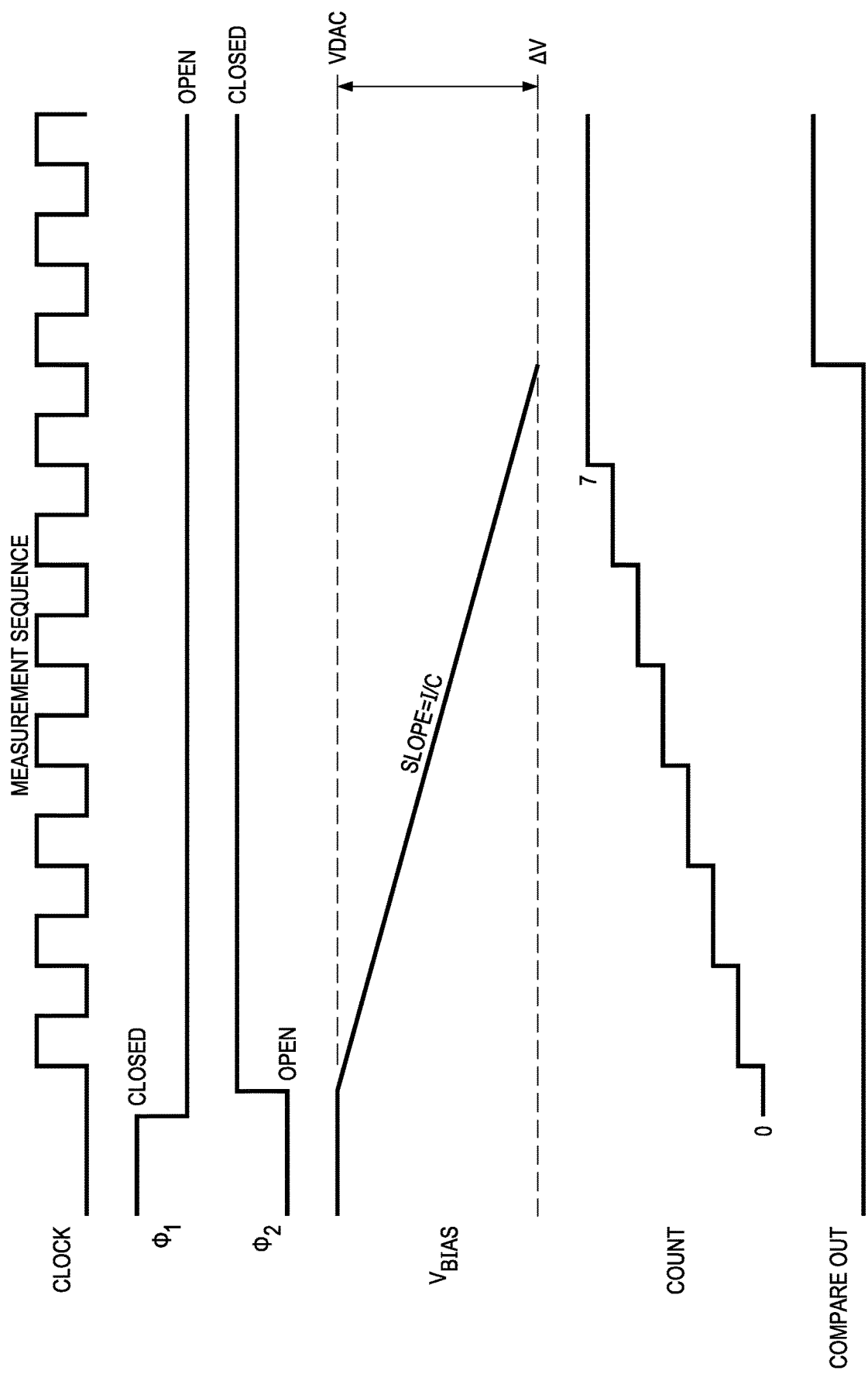
FIG. 4 is a diagram illustrating an exemplary capacitance measurement sequence using the calibration circuit of FIG. 3.

An exemplary capacitance measurement sequence is illustrated in FIG. 4. A clock signal is supplied to counter/timer 324 and digital controller 326. With top and bottom capacitor plates 306 and 308 spaced apart by a first unknown distance, switch 314 (indicated by $\varphi_1$ in FIG. 4) is closed to supply the voltage VDAC to charge the capacitive structure (represented by plates 306 and 308 in FIG. 3). Switch 316 is closed while switch 314 is open. Initially, $V_{BIAS}$, which is the voltage of the capacitive structure, is the same as VDAC. In response to a command from digital controller 326, counter/timer 324 is started to begin generating a count. Switch 314 is opened, and switch 316 (indicated by $\varphi_2$ in FIG. 4) is closed to apply $I_{REF}$ to the capacitive structure and begin discharge. Switches 314 and 316 may be controlled by digital controller 326.

As the voltage across the capacitive structure ($V_{BIAS}$) drops, counter/timer 324 provides an indication of the time it takes for $V_{BIAS}$ to drop to $V_{REF}$ (ΔV in FIG. 4) and outputs a count indicative of such time to digital controller 326. Digital controller 326 also receives from comparator 322 a digital signal when $V_{BIAS}$ becomes less than $V_{REF}$ (ΔV) indicating that sign change. The slope of the decrease of $V_{BIAS}$ during discharge is indicative of the ratio of the current ($I_{REF}$) across the capacitive structure to its capacitance, e.g., $I_{REF}/C$. From this information and based on the relationship I=Cdv/dt, where I is $I_{REF}$, digital controller 326 can calculate capacitance (C) across top and bottom capacitor plates 306 and 308.

This measurement sequence may then be repeated with plates 306 and 308 spaced apart by a second unknown distance, different from the first unknown distance. Before performing the next measurement sequence, digital controller 326 updates the control word sent to DAC 310 and resets counter/timer 324.

From these capacitance measurements and knowing the area of overlap between the top and bottom capacitors plate 306 and 308 (A), the difference between the first and second distances (displacement difference) may be determined using the capacitance formula: C=εA/d, where d is the distance between the capacitor plates and c is the dielectric constant. Rearranging gives: d=εA/C. Inputs A and c are stored in, or made available to, digital controller 326. In an example configuration in which all pixel structures 100 have the same configuration, A may be a single value representing the area of each mirror.

If the displacement difference is not what is desired, one or both of the control voltages, e.g., VDAC and $V_{OFFSET}$, may be adjusted and the process repeated. In an example, if the displacement difference is less than that desired, the voltage(s) may be adjusted such that the voltage differential applied to capacitor plates 306 and 308 is increased to increase electrostatic force and hence increase displacement; and if the displacement difference is greater than that desired, the voltage differential may be decreased to decrease electrostatic force and hence decrease displacement.

Figure 5:
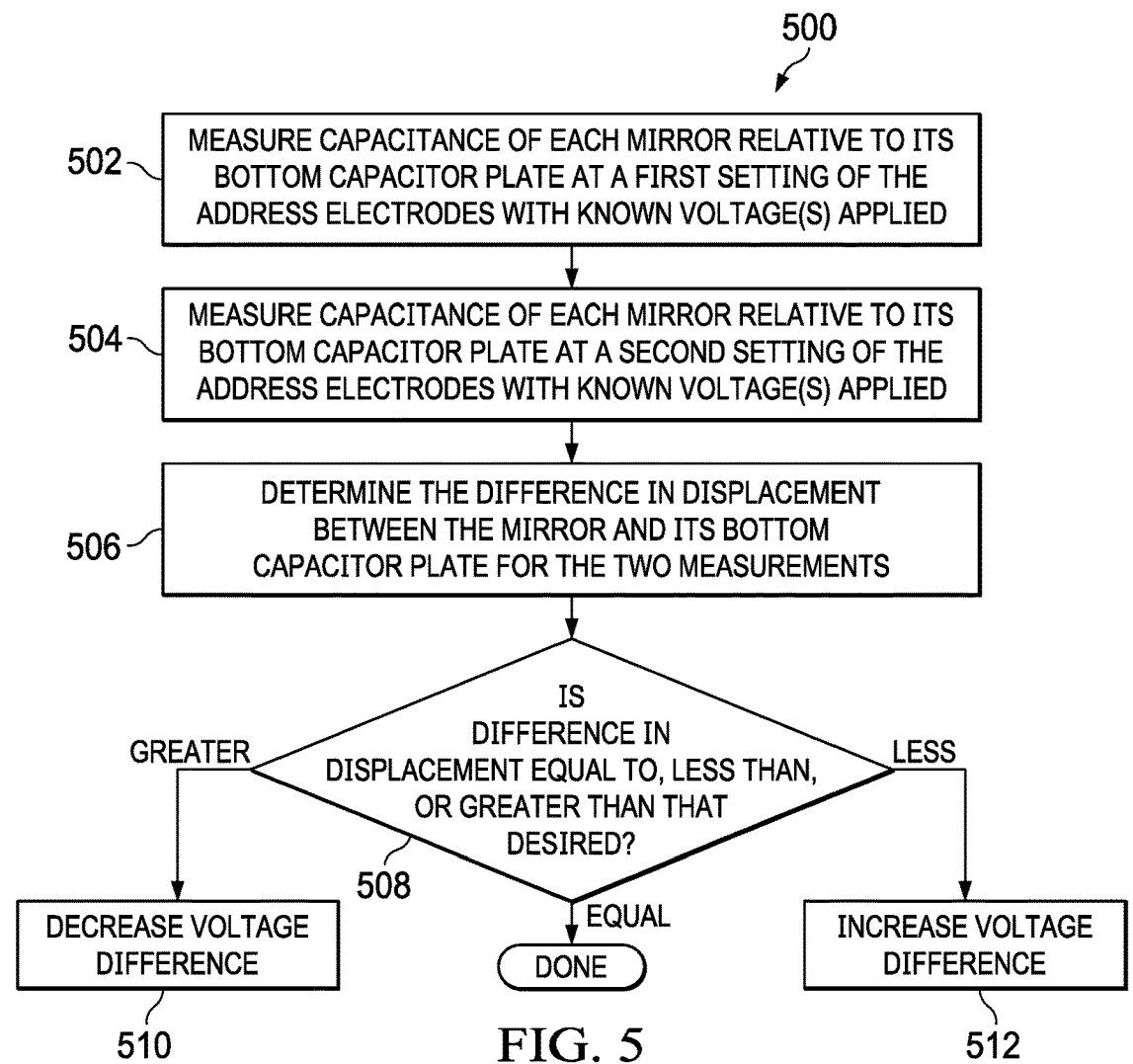
FIG. 5 is a flow diagram of an example method of calibrating one or more mirrors.

FIG. 5 is a flow diagram of an example method 500 of calibrating one or more mirrors of a PLM. For each mirror or pixel structure 100 to be calibrated, at operation 502 the capacitance of that mirror is measured at a first setting of the address electrodes of the bottom capacitor plate and known control voltage(s), e.g., $V_{BIAS}$ and/or $V_{OFFSET}$, are applied. Then, at operation 504, with the setting of the address electrodes changed to a second setting and known control voltage(s) are applied, the capacitance of each mirror is measured again. At operation 506, for each mirror being calibrated, the difference in displacement between that mirror and its bottom capacitor plate for the two measurements is determined. At operation 508, that difference in displacement is compared with a desired or target displacement. If the displacement difference is greater than desired, the difference between the control voltages is decreased in operation 510 and the process repeated. If the displacement difference is less than desired, the difference between the control voltages is increased in operation 512 and the process repeated. If the displacement difference is as desired, the process ends.

Figure 6:
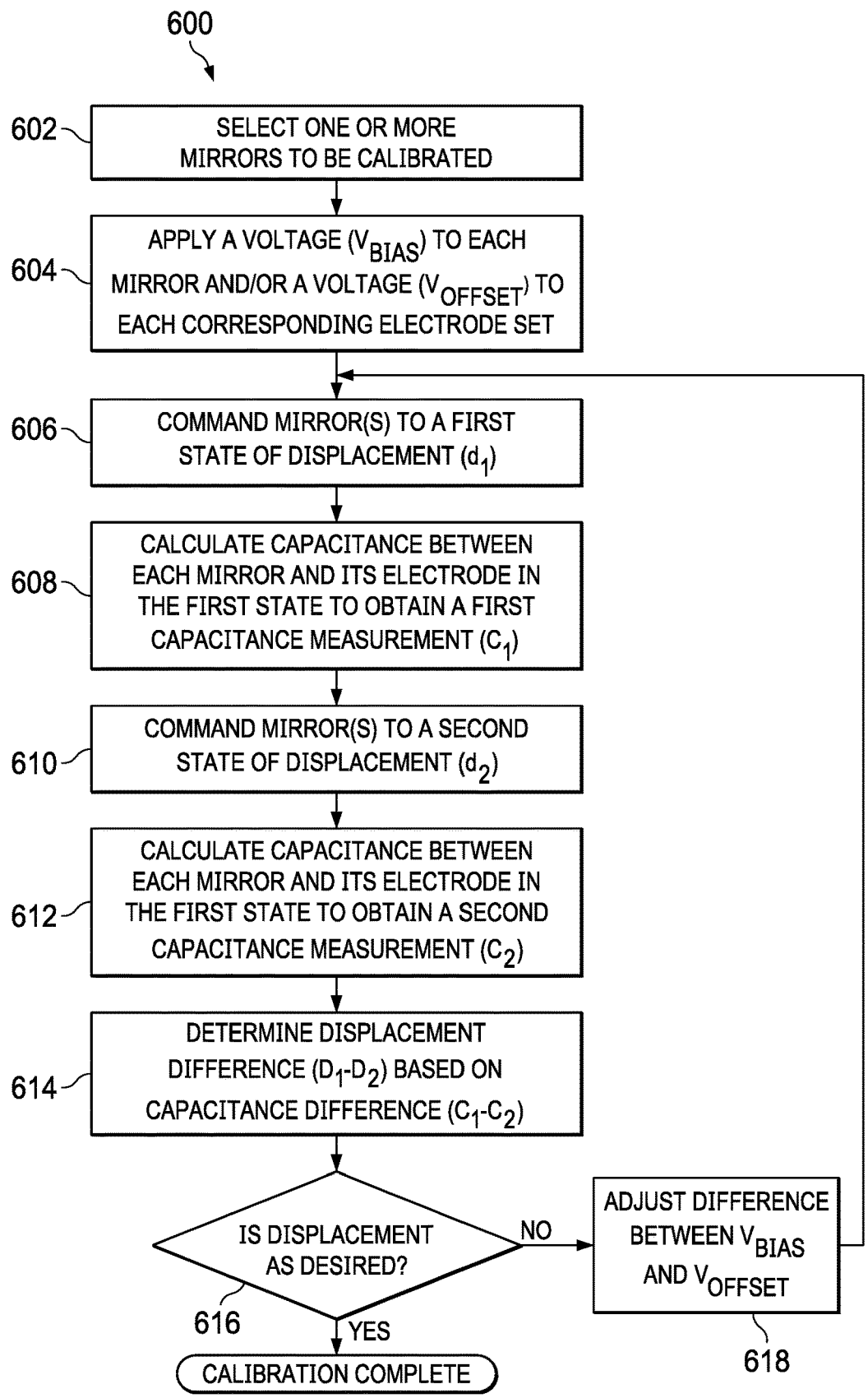
FIG. 6 is a flow diagram of an example method of calibrating one or more mirrors.

FIG. 6 is a flow diagram of an example method 600 of calibrating one or more mirrors of a device with an array of mirrors, such as a PLM. Initially, at operation 602, one or more mirrors that are to be calibrated are selected. For each mirror selected, a voltage $V_{BIAS}$ is applied to top capacitor plate 306 and/or a voltage $V_{OFFSET}$ is applied to electrodes of bottom capacitor plate 308 in operation 604. In operation 606, a first code is transmitted to the electrodes of each bottom capacitor plate 308 to set the top and bottom capacitor plates 306 and 308 of each mirror in a first state of displacement ($d_1$). In this first state of displacement, in operation 608, for each selected mirror, the capacitance of the capacitive structure is measured to obtain a first capacitance measurement ($C_1$). Then, in operation 610, a second code is transmitted to the electrodes of bottom capacitor plates 308 to set the top and bottom capacitor plates 306 and 308 of each mirror in a second state of displacement ($d_2$). In operation 612, for each selected mirror, capacitance of the capacitive structure is again measured at this second state of displacement to obtain a second capacitance measurement ($C_2$). In operation 614, ($d_1$–$d_2$) is determined based on ($C_1$–$C_2$). Next, in operation 616, it is determined whether the displacement difference is as desired. If not, one or both of $V_{BIAS}$ and $V_{OFFSET}$ is adjusted in operation 618, and the process returns to operation 606 to set another state of displacement. If the displacement difference is as desired, calibration is complete.

Calibration can be performed for differences in displacement for different wavelengths, to compensate for temperature differences, as well as to maintain consistency over the life of the device.

FIGS. 5 and 6 each depict one possible order of operations to calibrate mirror(s). Not all operations need necessarily be performed in the order described. Some operations may be combined into a single operation. Additional operations may be performed as well.

Figure 7:
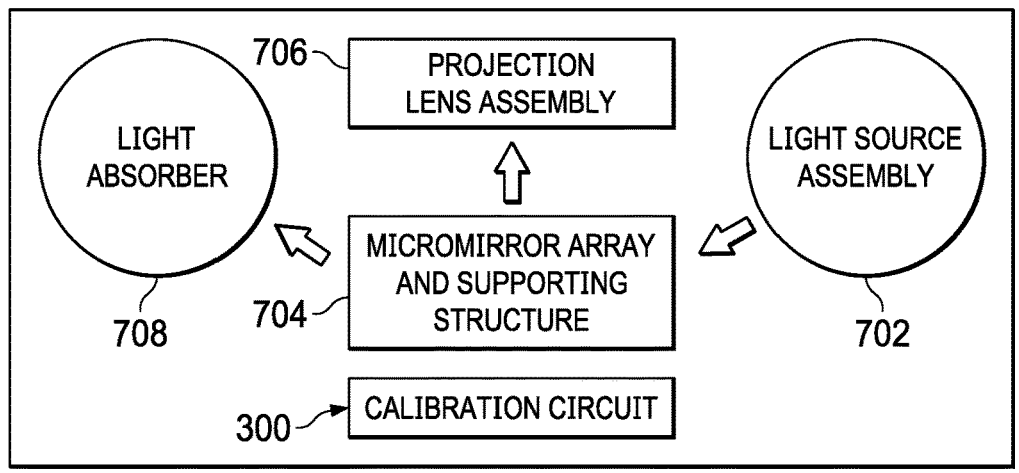
FIG. 7 is a block diagram of an example device including a calibration circuit and mirrors that may be calibrated according to examples described herein.

FIG. 7 is a block diagram of an example of a device 700, embodying or including a PLM, that includes calibration circuit 300. For example, device 700 may include a light source assembly 702, which may include a lamp or laser. In some examples, light source assembly 702 may also include one or more lenses. The light generated by light source assembly 702 is directed toward a micromirror array and supporting structure 704, which may include an array of pixel structures 100 described above. Device 700 may also include a projection lens assembly 706 to which selected micromirrors of the micromirror array direct light. Other micromirrors may direct light to a light absorber 708 or light dump. At various times throughout the life of device 700, calibration circuit 300 may be used to calibrate the micromirrors of device 700 according to examples described herein.

PLM technology may be applied in various applications, some of which may be categorized based on wavelength. In the ultraviolet portion of the spectrum, applications in lithography and 3D printing can be realized. In the visible spectrum, a PLM device can be used for augmented reality or virtual reality (AR/VR), or automobile headlights. In the near-infrared (NIR) space, the device can be used for telecommunication or ranging applications.

Various examples of calibration circuits, devices, and methods of calibrating mirror displacement in a device with movable mirror structures, e.g., a digitally controlled MEMS PLM, are provided. All calculations, measurements, comparisons, adjustments, etc. may be done in situ, i.e., in and by the device, e.g., PLM, in which calibration circuit 300 resides. Calibrations may be performed from time-to-time to compensate for variations in manufacturing processes, to adjust for different wavelengths, and/or to produce predictable results over an extended period of time, e.g., the lifetime of the device.

Modifications of the described examples are possible, as are other examples, within the scope of the claims. Moreover, features described herein may be applied in other environments and applications consist with the teachings provided.

What is claimed is:

1. A circuit comprising:
   a voltage generator having an input and an output, the output being selectively connectable to a first capacitor plate of a capacitive structure to supply a voltage to the capacitive structure;
   a digital controller having and an input and first and second outputs, the first output being coupled to the input of the voltage generator and the second output being coupled to a second capacitor plate of the capacitive structure;
   a reference voltage generator having an input and an output, the input being coupled to the output of the voltage generator, the reference voltage generator generating a reference voltage;
   a comparator having a first input, a second input, and an output, the first input being coupled to the output of the reference voltage generator to receive the reference voltage, the second input being selectively connectable to the capacitive structure to receive a discharging voltage, and the output being coupled to the input of the digital controller; and
   a current source that is selectively connectable to the capacitive structure.

2. The circuit of claim 1, wherein the output of the comparator is a first output and the input of the digital controller is a first input, the circuit further comprising a counter having a first input, a second input and an output, the first input being coupled to a second output of the comparator, the second input being coupled to a third output of the digital controller, and the output of the counter being coupled to a second input of the digital controller.

3. The circuit of claim 2, wherein the digital controller starts the counter at the start of a capacitance measurement and resets the counter after the capacitance measurement is completed.

4. The circuit of claim 3, wherein the digital controller receives a count from the counter in response to the counter receiving a stop instruction from the comparator.

5. The circuit of claim 4, wherein the comparator outputs a signal to the digital controller when the discharging voltage is less than the reference voltage.

6. The circuit of claim 5, wherein the digital controller calculates capacitance based on the count received from the counter, the signal received from the comparator, and a value indicative of a current of the current source.

7. The circuit of claim 1, further comprising a switch movable between a closed position in which the voltage generator is connected to the first capacitor plate and an open position in which the voltage generator is disconnected from the first capacitor plate.

8. The circuit of claim 7, wherein the switch is a first switch, the circuit further comprising a second switch movable between a closed position in which the current source is connected to the capacitive structure and an open position in which the current source is disconnected from the capacitive structure.

9. The circuit of claim 8, wherein, when the first switch is in the closed position, the second switch is in the open position.

10. The circuit of claim 1, wherein the digital controller outputs a first code to the voltage generator to control the voltage supplied to the capacitive structure and outputs a second code to the second capacitor plate to control position of the second capacitor plate with respect to the first capacitor plate.

11. The circuit of claim 1, wherein the capacitor is a pixel structure, the second capacitor plate is a base plate of the pixel structure, and the first capacitor plate comprises a mirror, a structure plate, and mirror attachments.

12. The circuit of claim 11, wherein the pixel structure is of an array of pixels in a phase light modulator (PLM).

13. A circuit comprising:
   a voltage generator having an input and an output;
   a first switch having a first terminal and a second terminal, the first terminal coupled to the output of the voltage generator;
   a second switch having a first terminal and a second terminal, the first terminal coupled to the second terminal of the first switch;
   a digital controller having and an input and an output, the output coupled to the input of the voltage generator;
   a reference voltage generator having an input and an output, the input coupled to the output of the voltage generator;
   a comparator having a first input, a second input, and an output, the first input coupled to the output of the reference voltage generator, the second input coupled to the second terminal of the second switch, and the output coupled to the input of the digital controller; and
   a current source coupled to the second terminal of the second switch.

14. The circuit of claim 13, wherein the digital controller outputs a first code to the voltage generator and outputs a second code.

15. The circuit of claim 13, wherein the output of the comparator is a first output and the input of the digital controller is a first input, the circuit further comprising a counter having a first input, a second input and an output, the first input being coupled to a second output of the comparator, the second input being coupled to a third output of the digital controller, and the output of the counter being coupled to a second input of the digital controller, wherein the digital controller starts the counter at the start of a capacitance measurement and resets the counter after the capacitance measurement is completed, and wherein the digital controller receives a count from the counter in response to the counter receiving a stop instruction from the comparator.

16. The circuit of claim 15, wherein the comparator outputs a signal to the digital controller when a voltage received at the second input of the comparator is less than a voltage received at the first input of the comparator, and wherein the digital controller calculates capacitance based on the count received from the counter, the signal received from the comparator, and a value indicative of a current of the current source.

17. A circuit comprising:
a phase light modulator (PLM) comprising a pixel element comprising a first capacitor plate and a second capacitor plate;
a voltage generator having an input and an output;
a first switch having a first terminal and a second terminal, the first terminal coupled to the output of the voltage generator;
a second switch having a first terminal and a second terminal, the first terminal coupled to the second terminal of the first switch;
a digital controller having and an input and an output, the output coupled to the input of the voltage generator;
a reference voltage generator having an input and an output, the input coupled to the output of the voltage generator;
a comparator having a first input, a second input, and an output, the first input coupled to the output of the reference voltage generator, the second input coupled to the second terminal of the second switch, and the output coupled to the input of the digital controller; and
a current source coupled to the second terminal of the second switch.

18. The circuit of claim 17, wherein the digital controller outputs a first code to the voltage generator to control the voltage supplied to the pixel element and outputs a second code to the second capacitor plate to control position of the second capacitor plate with respect to the first capacitor plate.

19. The circuit of claim 17, wherein the output of the comparator is a first output and the input of the digital controller is a first input, the circuit further comprising a counter having a first input, a second input and an output, the first input being coupled to a second output of the comparator, the second input being coupled to a third output of the digital controller, and the output of the counter being coupled to a second input of the digital controller, wherein the digital controller starts the counter at the start of a capacitance measurement and resets the counter after the capacitance measurement is completed, and wherein the digital controller receives a count from the counter in response to the counter receiving a stop instruction from the comparator.

20. The circuit of claim 19, wherein the comparator outputs a signal to the digital controller when a voltage received at the second input of the comparator is less than a voltage received at the first input of the comparator, and wherein the digital controller calculates capacitance based on the count received from the counter, the signal received from the comparator, and a value indicative of a current of the current source.

* * * * *